US009426914B2

United States Patent
Davison et al.

(10) Patent No.: US 9,426,914 B2
(45) Date of Patent: Aug. 23, 2016

(54) FILM INSERT MOLDING FOR DEVICE MANUFACTURE

(75) Inventors: Peter Davison, Puyallup, WA (US); David Pidwerbecki, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/997,871

(22) PCT Filed: May 17, 2012

(86) PCT No.: PCT/US2012/038421
§ 371 (c)(1),
(2), (4) Date: Sep. 25, 2013

(87) PCT Pub. No.: WO2013/172847
PCT Pub. Date: Nov. 21, 2013

(65) Prior Publication Data
US 2014/0022720 A1   Jan. 23, 2014

(51) Int. Cl.
| H01L 21/00 | (2006.01) |
| H05K 7/02 | (2006.01) |
| B29C 39/10 | (2006.01) |
| G06F 1/16 | (2006.01) |
| G06F 1/20 | (2006.01) |
| G06F 1/32 | (2006.01) |

(52) U.S. Cl.
CPC ........ H05K 7/02 (2013.01); B29C 39/10 (2013.01); G06F 1/1626 (2013.01); G06F 1/203 (2013.01); G06F 1/32 (2013.01)

(58) Field of Classification Search
USPC .................. 257/787, 790; 438/122, 127, 126
See application file for complete search history.

(56) References Cited

U.S. PATENT DOCUMENTS

| 5,097,317 A * | 3/1992 | Fujimoto | ................. C08K 3/08 257/786 |
| 5,672,908 A * | 9/1997 | Fujitsu | ................. H01L 23/3164 257/668 |
| 5,939,792 A * | 8/1999 | Ishikawa | ............. H01L 23/3135 257/787 |
| 6,191,492 B1 * | 2/2001 | Yamazaki | ........... H01L 23/3135 257/787 |

(Continued)

FOREIGN PATENT DOCUMENTS

| CN | 1551709 A | 12/2004 |
| CN | 101735563 A | 6/2010 |

(Continued)

OTHER PUBLICATIONS

International Search Report and Written Opinion received for PCT application No. PCT/US2012/038421, mailed on Feb. 28, 2013, 11 pages.

(Continued)

*Primary Examiner* — Sheila V Clark
(74) *Attorney, Agent, or Firm* — Jordan IP Law, LLC

(57) ABSTRACT

Systems and methods provide for a device including a film having a shape that defines an interior region. The device may also include one or more electronic components disposed within the interior region of the film, and a hardened thermo-set resin within the interior region, wherein the thermo-set resin encompasses the electronic components and substantially fills the interior region of the film. In one example, printed content is coupled to a surface of the film. In addition, the thermo-set resin may include an additive that is configured to absorb and distribute heat generated by the electronic components.

9 Claims, 2 Drawing Sheets

(56) References Cited

U.S. PATENT DOCUMENTS

| | | | |
|---|---|---|---|
| 6,621,153 B2* | 9/2003 | Kawai | G06K 19/041 257/679 |
| 8,507,080 B2* | 8/2013 | Mahler | B32B 7/12 257/783 |
| 2001/0035579 A1* | 11/2001 | Yoshida | H01L 23/3135 257/728 |
| 2001/0054469 A1 | 12/2001 | Kuriyama et al. | |
| 2004/0166754 A1 | 8/2004 | Bandou et al. | |
| 2004/0214006 A1 | 10/2004 | Hirayama et al. | |
| 2006/0175716 A1* | 8/2006 | Nakashima | 257/787 |
| 2007/0120272 A1* | 5/2007 | Nakagawa et al. | 257/787 |
| 2008/0225104 A1 | 9/2008 | Shoji et al. | |
| 2009/0189180 A1* | 7/2009 | Murai et al. | 257/100 |
| 2012/0068169 A1* | 3/2012 | Hirase et al. | 257/40 |
| 2014/0021503 A1* | 1/2014 | Yoshida et al. | 257/98 |
| 2014/0159076 A1* | 6/2014 | Sota et al. | 257/88 |

FOREIGN PATENT DOCUMENTS

| | | |
|---|---|---|
| CN | 102010566 A | 4/2011 |
| WO | 2013/172847 A1 | 11/2013 |

OTHER PUBLICATIONS

International Preliminary Report on Patentability and Written Opinion received for PCT application No. PCT/US2012/038421, mailed on Nov. 27, 2014, 8 pages.

Office Action and Search Report for Chinese Patent Application No. 201280072505.8, mailed Apr. 28, 2016, 31 pages including 22 pages of English translation.

* cited by examiner

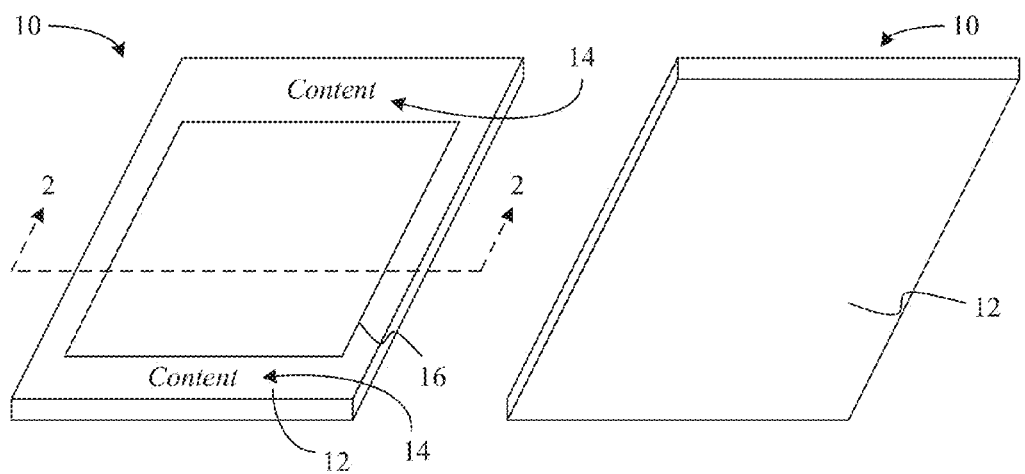
FIG. 1A  FIG. 1B
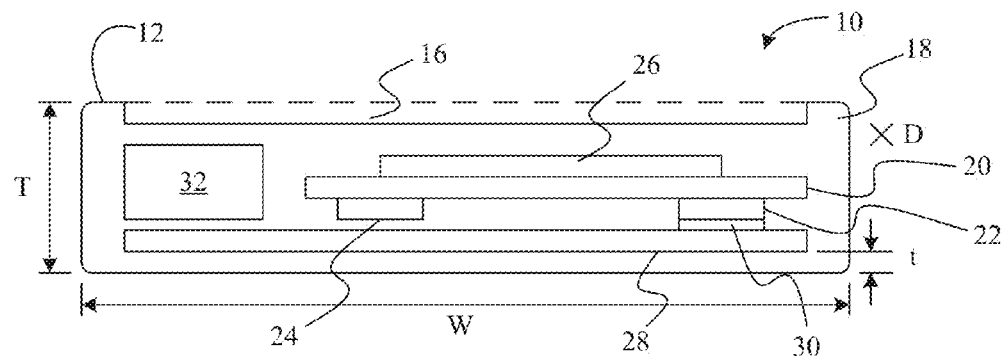
FIG. 2
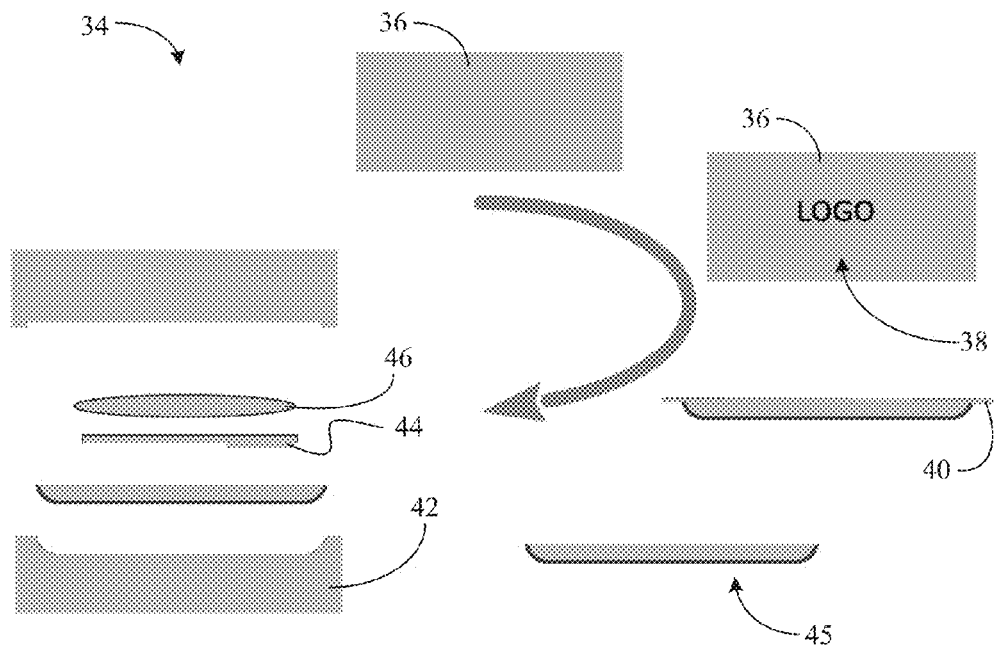
FIG. 3A

FIG. 3B
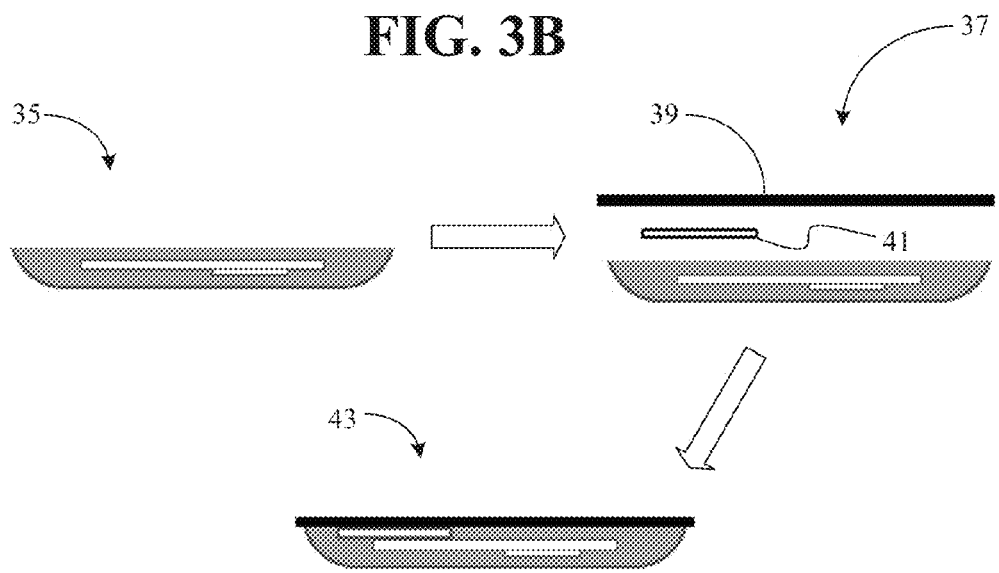
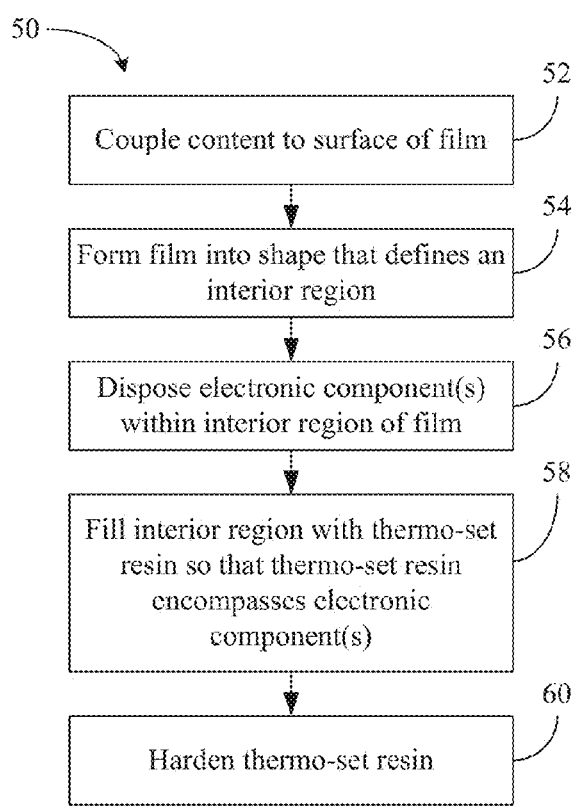
FIG. 4

FILM INSERT MOLDING FOR DEVICE MANUFACTURE

BACKGROUND

1. Technical Field

Embodiments generally relate to the manufacture of devices. More particularly, embodiments relate to the use of film insert molding to manufacture computing devices.

2. Discussion

Excessive skin temperatures in computing devices can be an area of concern, particularly with shrinking device form factors and possibly a growing number of heat generating components. While fan-based cooling solutions may be used to obviate certain heat-related concerns, there remains considerable room for improvement. For example, fans can be large, loud and costly, and may consume battery power, particularly with respect to handheld devices.

BRIEF DESCRIPTION OF THE DRAWINGS

The various advantages of the embodiments of the present invention will become apparent to one skilled in the art by reading the following specification and appended claims, and by referencing the following drawings, in which:

FIGS. 1A and 1B are front and back perspective views, respectively, of an example of a computing device according to an embodiment;

FIG. 2 is a sectional view taken along lines 2-2 in FIG. 1A;

FIGS. 3A and 3B are block diagrams of an example of a manufacturing process according to an embodiment; and FIG. 4 is a flowchart of an example of a manufacturing process according to an embodiment.

DETAILED DESCRIPTION

Turning now to FIGS. 1A and 1B, a device 10 is shown. In the illustrated example, the device 10 has an outer skin 12 that is manufactured from a film including a material such as, for example, a plastic (e.g., polycarbonate), metal and/or flame retardant material. As will be discussed in greater detail, the skin 12 may be substantially filled by a thermo-set resin/epoxy, wherein the resin may include any castable material such as acrylics, silicones, epoxies, urethanes, etc. Thus, the resin can have both thermal and UV (ultraviolet) curing properties. In one example, the resin encompasses the internal components of the device 10, wherein the thermo-set resin can be configured to absorb, store and/or distribute heat generated by the internal components of the device 10 during operation. In particular, the storage of heat might be accomplished via a phase transition configuration in which the resin and/or additive transitions to different crystalline structures, melts, vaporizes, etc., as heat is absorbed. Moreover, the distribution of heat by the thermo-set resin can occur gradually over time. In one example, the device 10 is an "ultra-thin" smart tablet having a touch screen 16 and a very thin form factor. Other computing devices such as a personal digital assistant (PDA), mobile Internet device (MID), wireless smart phone, media player, imaging device, notebook/netbook computer, desktop personal computer (PC), server, embedded device, and so forth, may also be used.

The illustrated device 10 also includes content 14 such as text, graphics, logos, etc., wherein the content 14 may be printed on interior or exterior surfaces of the skin 12. For example, the skin 12 may be transparent so that the color of the thermo-set resin gives the device 10 its external visual appearance, with the content 14 being printed in a different color to provide a contrasting effect. In such a case, the texture of the device 10 would still be provided by the skin 12, which may be desirable from a user standpoint, in particular, the thermo-set resin may typically be relatively rough to the touch or have surface defects including: porosity; knit lines; flow marks; color issues, etc.

The film 12, on the other hand, may be relatively smooth and can provide excellent color reproduction/art work fidelity, etc., depending upon the type of film material surface used. In another example, the skin 12 may itself have a desired color to be used as the external visual appearance of the device 10, with the content 14 being printed in a different color and/or design from that of the skin 12. In yet another example, the portion of the skin 12 corresponding to the content 14 may be reverse printed (e.g., left transparent) so that the content 14 takes on the color/appearance of the thermo-set resin. Other techniques of printing the content 14 to the skin 12 may also be used. Indeed, the content 14 may be printed in raised and/or recessed portions of the skin 12 so as to provide a 3D (three-dimensional) effect to the content 14. Of particular note is that printing the content 14 on the interior surfaces of the skin 12 can provide a high level of protection of the content 14 from scratches and other abrasive forces that may otherwise lead to removal of the content 14 from the skin 12 over time. Notwithstanding, the content 14 may also be printed on exterior surfaces of the skin 12. In addition, the skin 12 of the device may be a formed or machined metal component.

FIG. 2 shows a sectional view of the device 10 in which a thermo-set resin 18 contains a phase change material (PCM) that substantially fills the skin 12 and encompasses one or more components of the device 10. In the illustrated example, the device 10 includes a battery 32 and a circuit board 20 having electronic components such as one or more processors 22 and a memory controller 24 mounted thereon. Other electronic components such as, for example, memory modules and chipset components may also be coupled to the circuit board 20, wherein the electronic components may generate heat during operation of the device 10. In particular, the memory controller 24 may facilitate the storage and retrieval of data from one or more memory modules (not shown), and the processors 22 may have cores configured to execute one or more drivers associated with a host OS (operating system) and/or application software, wherein each core may be fully functional with instruction fetch units, instruction decoders, level one (L1) cache, execution units, and so forth.

In one example, the memory modules include double data rate (DDR) synchronous dynamic random access memory (SDRAM, e.g., DDR3 SDRAM JEDEC Standard JESD79-3C, April 2008) modules, wherein one or more of the modules of may be incorporated into a single inline memory module (SIMM), dual inline memory module (DIMM), small outline DIMM (SODIMM), and so forth. Other "passives" (e.g., non-heat generating components) 26 may also be coupled to the circuit hoard 20. In general, the illustrated electronic components may generate a considerable amount of heat during operation. Accordingly, in the illustrated example, the processors 22 are coupled to a heat spreader 28 via a thermal interface material (TIM) 30, wherein the TIM 30 and heat spreader 28 may facilitate the transfer of heat from the processors 22 to the surrounding thermo-set resin 18.

In particular, the thermo-set resin 18 may include an additive (e.g., "Phase Change Material" spheres) to absorb, store and distribute heat generated by electronic components such as the processors 22 and memory controller 24 during operation of the device 10. Once hardened (e.g., cured), the thermo-set resin 18 may therefore function as a rigid structural core as well as an energy storage material for the device 10. Indeed, the illustrated device 10 can survive drops and shocks, and may even maintain functionality in underwater conditions. Moreover, the film-based skin 12 can obviate any concerns regarding the appearance and/or abrasion resistance of the thermo-set resin 18. Of particular note is that the illustrated device 10 lacks a fan due to the ability of the thermo-set resin 18 to absorb and distribute heat.

In addition, the thickness (T) of the device 10 may be extremely low (e.g., less than 18-20 mm) relative to the width (W, e.g., 280 mm) and depth (D, 180 mm) of the device 10. The skin thickness (t, e.g., 1-2 mm) may vary depending a number of concerns such as, for example, the minimum energy storage/resin ingress gap and/or ingress.

Turning now to FIG. 3A, a device manufacturing process 34 is shown. In the illustrated example, a film 36 undergoes a printing operation in which various colors, text, graphics, logos and other decorations are applied to the film 36. In the illustrated example, content 38 is coupled to a surface of the film 36 at a particular location. As already noted, the content 38 may be printed to what will become the interior surface of the film 36. The film 36 may then be formed (e.g., drawn) into a shape that defines an interior region, wherein the forming operation might result in one or more flange pieces 40. For example, a stamping or plastic thermoforming operation could be used to form the film 36 around and/or into a mold having the desired shape. The film may be trimmed to remove the flange pieces 40 and obtain the final shaped skin at stage 45. The trimmed film may be placed in a mold 42, along with one or more electronic components 44 and a thermo-set resin 46, which substantially encompasses the electronic components 46 using a low pressure (e.g., <200 psi). The mold may be the same or different from the mold used to form the film. The thermo-set resin 46 may be hardened (e.g., cured) at a slightly elevated or room temperature (e.g., less than approximately sixty degrees Celsius), wherein subsequent to hardening, the film can be used as a release layer to remove the computing device from the mold 42.

FIG. 3B demonstrates that at manufacturing stage 35, the electronic components may be embedded in the resin. At stage 37, batteries 41 and a touch panel 39 may be added to the device, wherein the completed device can result at stage 43.

FIG. 4 shows a method 50 of a manufacturing a device. The method 50 may be implemented using one or more well-documented manufacturing technologies such as, for example, plastics forming, casting, metal stamping (e.g., progressive draw, deep draw), assembly, and so forth. Illustrated processing block 52 provides for coupling content to a surface of a film, wherein the content may be coupled to the surface by printing the content onto the surface, drawing the content into the surface (e.g., as in raised letters in a plastic surface), and so forth. Block 54 may form the film into a shape that defines an interior region at block 54. Blocks 52 and 54 may therefore include, for example, the use of screen printing and in mold decorating (IMD) technology to transfer art work to one or more interior and/or exterior surfaces of the film in a precision die. The IMD film may then be installed into a resin fill mold, wherein illustrated block 56 disposes one or more electronic components, heat spreaders, and so forth within the interior region of the film.

The interior region may also be substantially filled at block 58 with a thermo-set resin so that the resin encompasses the electronic components. The thermo-set resin may be hardened at block 60. For example, blocks 58 and 60 might involve degassing the resin, preheating the resin to a slightly elevated temperature such as 50° C., heating the mold to the slightly elevated temperature, and pressurizing the resin fill mold to flow the resin throughout the mold, wherein the composite may be cured at temperatures above 50° C. A final seal may also be provided for a touch screen panel, if necessary. Thus, the thermo-set resin can contain a heat absorbing and distributing additive, and may be hardened at or near room temperature. The order in which the illustrated processing blocks may be implemented is shown to facilitate discussion only, and may vary depending upon the circumstances.

Embodiments may therefore include a device having a film with a shape that defines an interior region, and an electronic component disposed within the interior region of the film. The device may also include a cured resin disposed within the interior region, wherein the resin encompasses the electronic component and substantially fills the interior region of the film.

Embodiments may also include a method of constructing a device in which a film is formed into a shape that defines an interior region. The method may also provide for disposing an electronic component within the interior region of the film, and substantially filling the interior region of the film with a resin, wherein the resin encompasses the electronic component. In addition, the resin may be hardened.

Moreover, embodiments may include a computing device having a film with a shape that defines an interior region, wherein the film includes one or more of a plastic material, a metal material, and a flame retardant material. The computing device may also have an electronic component disposed within the interior region, wherein the electronic component includes a circuit board having one or more of a processor, a memory controller, a memory module, and a chipset component. In addition, the computing device has a cured resin disposed within the interior region, wherein the resin encompasses the electronic component, substantially fills the interior region of the film, and includes an additive that is configured to absorb and distribute heat generated by the electronic component during operation of the computing device.

Additionally, embodiments may include a method of constructing a computing device in which a film is disposed within a mold and the mold is used to provide the film with a shape that defines an interior region. In one example, the film includes one or more of a plastic material, a metal material, and a flame retardant material. In addition, the film may be trimmed, wherein an electronic component may be disposed within the interior region of the film. The electronic component may include a circuit board having one or more of a processor, a memory controller, a memory module, and a chipset component. The method may also involve incorporating an additive into a resin, and substantially filling the interior region of the film with the resin, wherein the resin encompasses the electronic component and the additive is configured to absorb and distribute heat generated by the electronic component during operation of the computing device. Moreover, the method may provide for hardening the resin at room temperature, and using the film as a release layer to remove the computing device from the mold.

Techniques described herein may therefore enable customer-facing surfaces to be abrasion resistant, with the possibility of exhibiting exceptional performance (e.g., passing a steel wool test, depending on the film material selected). Moreover, high resolution graphics such as logos, graphite fiber weaves artwork, photo ready artwork, etc., can be printed on the inside of the film and protected by the film, which would be damaged prior to any damage to the printed content. Indeed, a desirable "watery" appearance may be imparted to the printed content depending upon the circumstances. Additionally, the thermo-set resin molding process may be relatively low pressure compared to conventional plastics injection molding pressures, and the external skin texture of the device can be changed by merely selecting another surface treatment for the film material. Moreover, the elimination of fans can reduce power consumption and extend battery life.

Embodiments of the present invention are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments of the present invention are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments of the invention. Further, arrangements may be shown in block diagram form in order to avoid obscuring embodiments of the invention, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments of the invention, it should be apparent to one skilled in the art that embodiments of the invention can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. might be used herein only to facilitate discussion, and carry no particular temporal or chronological significance unless otherwise indicated.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

We claim:

1. A method of constructing a device comprising:
   forming a film into a shape that defines an interior region;
   disposing an electronic component within the interior region of the film;
   incorporating an additive into a thermo-set resin, wherein the additive is configured to absorb, store and distribute heat generated by the electronic component during operation of the device, and wherein the resin includes a castable material;
   substantially filling the interior region of the film with the thermo-set resin, wherein the thermo-set resin encompasses the electronic component; and
   hardening the thermo-set resin.

2. The method of claim 1, further including coupling content to a surface of the film prior to forming the film.

3. The method of claim 2, wherein the content is coupled to one or more of an interior surface and an exterior surface of the film.

4. The method of claim 2, wherein the content is one or more of printed onto and drawn into the surface of the film.

5. The method of claim 1, wherein the thermo-set resin is hardened at a temperature below approximately sixty degrees Celsius.

6. The method of claim 1, wherein forming the film includes:
   disposing the film within a mold;
   using the mold to provide the film with the shape that defines the interior region; and
   trimming the film.

7. The method of claim 6, further including using the film as a release layer to remove the device from the mold.

8. The method of claim 1, wherein forming the film includes forming a film having one or more of a plastic material, a metal material, and a flame retardant material.

9. The method of claim 1, wherein the device is a computing device and disposing the electrical component within the interior region of the film includes disposing a circuit board having one or more of a processor, a memory controller, a memory module, and a chipset component within the interior region.

* * * * *